United States Patent
Nakamura et al.

(10) Patent No.: US 10,739,135 B2
(45) Date of Patent: Aug. 11, 2020

(54) DISTANCE MEASURING APPARATUS

(71) Applicant: Panasonic Intellectual Property Management Co., Ltd., Osaka (JP)

(72) Inventors: Seiji Nakamura, Osaka (JP); Keiichi Mori, Osaka (JP)

(73) Assignee: PANASONIC INTELLECTUAL PROPERTY MANAGEMENT CO., LTD., Kyoto (JP)

(*) Notice: Subject to any disclaimer, the term of this patent is extended or adjusted under 35 U.S.C. 154(b) by 303 days.

(21) Appl. No.: 15/870,433

(22) Filed: Jan. 12, 2018

(65) Prior Publication Data
US 2018/0135980 A1 May 17, 2018

Related U.S. Application Data

(63) Continuation of application No. PCT/JP2016/003320, filed on Jul. 14, 2016.

(30) Foreign Application Priority Data

Jul. 22, 2015 (JP) .................. 2015-144944

(51) Int. Cl.
*G01C 3/08* (2006.01)
*G01C 3/06* (2006.01)
(Continued)

(52) U.S. Cl.
CPC ............. *G01C 3/06* (2013.01); *G01S 7/4808* (2013.01); *G01S 7/497* (2013.01); *G01S 17/10* (2013.01);
(Continued)

(58) Field of Classification Search
CPC .......... G01S 17/10; G01S 17/89; G01S 17/36; H01L 27/144; G01C 3/06
(Continued)

(56) References Cited

U.S. PATENT DOCUMENTS

| | | | |
|---|---|---|---|
| 6,522,839 B2* | 2/2003 | Ide ...................... | G03B 13/34 396/121 |
| 2008/0157012 A1* | 7/2008 | Tachino ................ | G01S 17/89 250/552 |

(Continued)

FOREIGN PATENT DOCUMENTS

| | | |
|---|---|---|
| JP | 2009-124398 A | 6/2009 |
| JP | 2013-076645 A | 4/2013 |

(Continued)

OTHER PUBLICATIONS

International Search Report issued in Application No. PCT/JP2016/003320 dated Sep. 27, 2016, with English translation.

*Primary Examiner* — Mark Hellner
(74) *Attorney, Agent, or Firm* — McDermott Will & Emery LLP

(57) ABSTRACT

A distance measuring apparatus includes a light source, a light source controller, a light receiver including pixels arranged two-dimensionally, an exposure controller, and a signal processor. The light receiver outputs, to the signal processor, a signal corresponding to the amount of electric charge accumulated in the accumulator. The signal processor determines that the interference is present when at least one of (i) a ratio between signal levels of the same pixel included in the pixels, the signal levels representing respective amounts of electric charge in respective exposure periods and (ii) a ratio between signal levels of the first and second pixels exceeds a predetermined threshold with respect to a determination criterion that is based on a difference between a period in which a read gate of the first pixel is open and a period in which a read gate of the second pixel is open.

17 Claims, 12 Drawing Sheets

(51) Int. Cl.
  *G01S 17/10*  (2020.01)
  *G01S 7/497*  (2006.01)
  *G01S 17/89*  (2020.01)
  *G01S 7/48*  (2006.01)
  *G01S 17/36*  (2006.01)
  *H01L 27/144*  (2006.01)

(52) U.S. Cl.
  CPC .............. *G01S 17/36* (2013.01); *G01S 17/89* (2013.01); *H01L 27/144* (2013.01)

(58) Field of Classification Search
  USPC ....................................................... 356/5.01
  See application file for complete search history.

(56) References Cited

U.S. PATENT DOCUMENTS

| | | |
|---|---|---|
| 2009/0122297 A1 | 5/2009 | Ikeno et al. |
| 2013/0088620 A1 | 4/2013 | Centen et al. |

FOREIGN PATENT DOCUMENTS

| | | |
|---|---|---|
| JP | 2013-235390 A | 11/2013 |
| WO | 2011/157712 A1 | 12/2011 |

\* cited by examiner

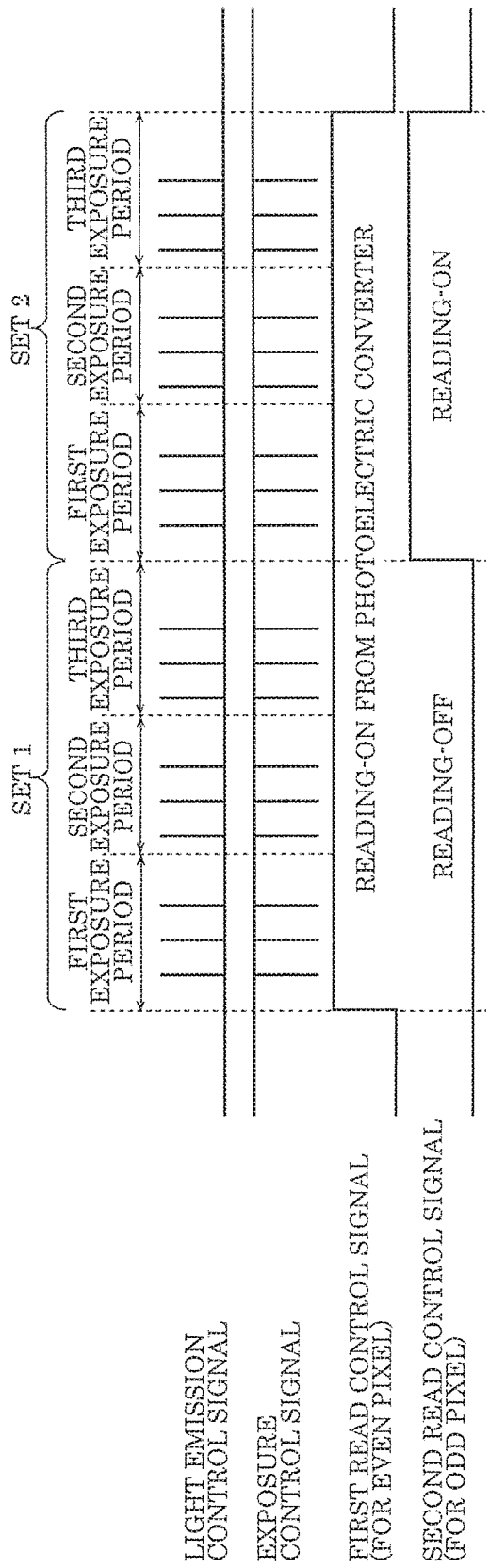

DISTANCE MEASURING APPARATUS

CROSS REFERENCE TO RELATED APPLICATIONS

This application is a U.S. continuation application of PCT International Patent Application Number PCT/JP2016/003320 filed on Jul. 14, 2016, claiming the benefit of priority of Japanese Patent Application Number 2015-144944 filed on Jul. 22, 2015, the entire contents of which are hereby incorporated by reference.

BACKGROUND

1. Technical Field

The present disclosure relates to a three-dimensional distance measurement technology with which a distance to a subject present in a measurement area is measured by emitting light to the subject and receiving light reflected from the subject.

2. Description of the Related Art

There is a known distance measurement technology that calculates a distance to an object using a time of flight (TOF) that is a length of time it takes from emission of a light pulse into a measurement-target space to reception of the reflected light (hereinafter, this technology is referred to as the TOF method). With the TOF method, when light emitted from a different distance measuring apparatus is also received in addition to the light from the present distance measuring apparatus, correct distance information cannot be obtained.

Japanese Unexamined Patent Application Publication No. 2013-235390, for example, discloses a distance measuring apparatus that prevents interference of light emitted from a different distance measuring apparatus. To be more specific, when a different distance measuring apparatus that can possibly cause interference is known in advance and this different distance measuring apparatus is affixed to, for example, a wall, the distance measuring apparatus disclosed in this patent literature prevents occurrence of interference by determining whether the reflected light is received from the different distance measuring apparatus during a specific interference detection period. This patent literature discloses a method of resetting the timing of a light pulse to be emitted from the present distance measuring apparatus to a predetermined phase before interference actually occurs.

Moreover, Japanese Unexamined Patent Application Publication No. 2013-76645 discloses a distance measuring apparatus that uses a continuous wave (CW)-TOF method. With this method, an exposure pulse signal having different phases within one light emission cycle is inputted, and a waiting time is randomly set for each cycle of light emission and exposure. As a result, even when interference of light is present, a plurality of charge accumulators receive similar amounts of light. Thus, although interference cannot be detected, influence of the interference can be reduced.

SUMMARY

When a distance to a subject is measured using the TOF method and light emitted from a different distance measuring apparatus is also received in addition to the light from the present distance measuring apparatus, correct distance information cannot be obtained.

To solve this problem, Japanese Unexamined Patent Application Publication No. 2013-235390 discloses the distance measuring apparatus that can detect interference only when the different distance measuring apparatus that can possibly cause interference is known in advance and this different distance measuring apparatus is affixed to, for example, a wall. With this technology, however, it is difficult to detect interference when the different distance measuring apparatus is not fixed in place and when it is not known exactly when such interference with a light emission pulse from the different distance measuring apparatus will occur.

The distance measuring apparatus using the CW-TOF method that is disclosed in Japanese Unexamined Patent Application Publication No. 2013-76645 can reduce the influence of the interference. However, this distance measuring apparatus cannot detect interference. Thus, when signal saturation occurs, for example, this distance measuring apparatus cannot determine whether this signal saturation is caused by the influence of the reflected light or the influence of the interfering light. As a result, automatic exposure (AE) cannot be performed correctly.

In view of the aforementioned problem, an object of the distance measuring apparatus according to the present disclosure is to reliably detect an occurrence of interference of a light emission pulse from a different distance measuring apparatus and to reduce influence of this interference.

To achieve the aforementioned object, a distance measuring apparatus according to an aspect of the present disclosure is a distance measuring apparatus which uses a time-of-flight (TOF) method and includes: a light source which emits light; a light source controller which issues a light emission instruction to the light source at a predetermined timing; a light receiver which includes a plurality of pixels that receive incident light and are arranged two-dimensionally; an exposure controller which issues an exposure instruction to the light receiver; and a signal processor which calculates data of a distance to a subject using a signal received by the light receiver, and determines whether interference is present, wherein each of the plurality of pixels includes: a photoelectric converter which converts the incident light into electric charge; an accumulator which accumulates the electric charge; and a read gate that passes the electric charge converted by the photoelectric converter to the accumulator, the plurality of pixels include: a first pixel which opens and closes the read gate according to a first read control signal that has a predetermined timing; and a second pixel which opens and closes the read gate according to a second read control signal that has a timing different from the predetermined timing of the first read control signal, the exposure controller issues the exposure instruction by outputting the first read control signal and the second read control signal to the light receiver, the light receiver outputs, to the signal processor, a signal corresponding to an amount of electric charge accumulated in the accumulator, and the signal processor determines that the interference is present when at least one of (i) a ratio between signal levels of a same pixel included in the plurality of pixels, the signal levels representing respective amounts of electric charge in respective exposure periods and (ii) a ratio between a signal level of the first pixel and a signal level of the second pixel exceeds a predetermined threshold with respect to a determination criterion that is based on a difference between a period in which the read gate of the first pixel is open and a period in which the read gate of the second pixel is open.

With this, the distance measuring apparatus using the TOF method can dynamically detect the interference of the light emission pulse from a different distance measuring apparatus.

Moreover, a distance measuring apparatus according to another aspect of the present disclosure is a distance measuring apparatus which uses a time-of-flight (TOF) method and includes: a light source which emits light; a light source controller which issues a light emission instruction to the light source at a predetermined timing; a light receiver which includes a plurality of pixels that receive incident light and are arranged two-dimensionally; an exposure controller which issues an exposure instruction to the light receiver; and a signal processor which calculates data of a distance to a subject using a signal received by the light receiver, and detects whether interference is present, wherein each of the plurality of pixels includes: a photoelectric converter which converts the incident light into electric charge; an accumulator which accumulates the electric charge; and a read gate that passes the electric charge converted by the photoelectric converter to the accumulator, the plurality of pixels include: a first pixel which opens and closes the read gate according to a first read control signal that has a predetermined timing; and a second pixel which opens and closes the read gate according to a second read control signal that has a timing different from the predetermined timing of the first read control signal, the light receiver includes the first pixel and the second pixel which are arranged alternately, the exposure controller issues the exposure instruction by outputting the first read control signal and the second read control signal to the light receiver, the light receiver outputs, to the signal processor, a signal corresponding to an amount of electric charge accumulated in the accumulator, and the signal processor determines that the interference is present when a ratio between a signal level of the first pixel and a signal level of the second pixel adjacent to the first pixel exceeds a predetermined threshold with respect to a ratio between a period in which the read gate of the first pixel is open and a period in which the read gate of the second pixel is open, calculates, when it is determined for the first pixel and the second pixel that the interference is not present, the data of the distance to the subject using a signal in which a signal of the first pixel and a signal of the second pixel adjacent to the first pixel are mixed, and outputs, when it is determined for the first pixel and the second pixel that the interference is present, the data of the distance using one of the first pixel and the second pixel that is determined as being less influenced by the interference on the basis of a magnitude relationship between (i) the ratio between the signal level of the first pixel and the signal level of the second pixel and (ii) the ratio between the period in which the read gate of the first pixel is open and the period in which the read gate of the second pixel is open.

With this, the interference of the light emission pulse from the different distance measuring apparatus can be dynamically detected, and the two pixels having the different charge accumulation periods are mixed to calculate the distance measurement data. Thus, the dynamic range for distance measurement can be increased. Furthermore, when the interference of the light emission pulse from the different distance measuring apparatus is detected, the distance measurement data is calculated using the pixel that is less influenced by the interference. As a result, the influence of the interference can be reduced.

According to the present disclosure, occurrence of interference of a light emission pulse from a different distance measuring apparatus can be reliably detected and influence of this interference can be reduced.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 10A is a timing chart showing a light emission control signal, an exposure control signal, a first read control signal, and a second read control signal according to Embodiment 3 and also showing the case where an "H" period of the first read control signal coincides with an "H" period of the second read control signal;

DETAILED DESCRIPTION OF THE EMBODIMENTS

The following specifically describes a distance measuring apparatus according to exemplary embodiments of the present disclosure, with reference to the drawings.

It should be noted that each of the exemplary embodiments described below shows a general or specific example. Therefore, the numerical values, shapes, materials, structural elements, the arrangement and connection of the structural elements, steps, the processing order of the steps, and so forth shown in the exemplary embodiments below are mere examples, and therefore do not limit the present disclosure. Thus, among the structural elements in the following exemplary embodiments, structural elements that are not recited in any one of the independent claims indicating top concepts according to the present disclosure are described as arbitrary structural elements.

Embodiment 1

Figure 1A:
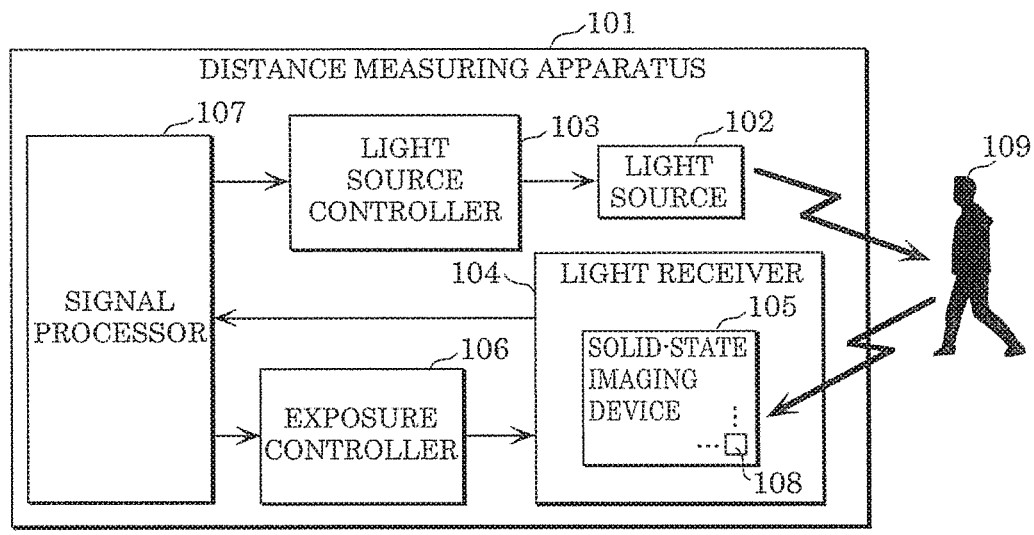
FIG. 1A is a block diagram showing a configuration of a distance measuring apparatus according to Embodiments 1 and 2.

FIG. 1A is a block diagram showing a configuration of distance measuring apparatus 101 according to Embodiment 1.

As shown in FIG. 1A, distance measuring apparatus 101 includes light source 102, light source controller 103, light receiver 104, exposure controller 106, and signal processor 107. Light receiver 104 includes solid-state imaging device 105.

Light source 102 emits light to the outside according to a timing indicated by a received light emission control signal. Light source 102 may be a light-emitting diode (LED) or a laser diode (LD).

Light source controller 103 outputs a light emission control signal to light source 102. The light emission control signal is a binary digital signal having a value represented as either "H" or "L". In the present embodiment, "H" refers to light emission and "L" refers to light emission stop. Light source controller 103 does not issue a light emission instruction, or more specifically, does not output a light emission control signal, in either a period in which read gate 111 of pixel 108a belonging to a first pixel group is open or a period in which read gate 111 of pixel 108b belonging to a second pixel group is open. These pixels are described later.

Light receiver 104 includes solid-state imaging device 105 in which pixels 108 are arranged two-dimensionally. Solid-state imaging device 105 may be a charge-coupled device (CCD) sensor or a complementary metal oxide semiconductor (CMOS) sensor. Light receiver 104 captures light from the outside according to the exposure control signal, and then outputs a digital signal corresponding to the amount of exposure.

Exposure controller 106 outputs an exposure control signal to solid-state imaging device 105. The exposure control signal is a binary digital signal having a value represented as either "H" or "L". In the present embodiment, "H" refers to exposure and "L" refers to exposure stop.

Moreover, exposure controller 106 performs control in a manner that the period in which read gate 111 of pixel 108a belonging to the first pixel group is open does not coincide with the period in which read gate 111 of pixel 108b belonging to the second pixel group is open. These pixels are described later. To be more specific, exposure controller 106 outputs, to solid-state imaging device 105, two read control signals (a first read control signal and a second read control signal) that are different in timing from each other. Each of pixels 108 of solid-state imaging device 105 can temporarily accumulate electric charge obtained through light conversion when the corresponding first or second read control signal is "H". However, pixel 108 cannot accumulate the electric charge when the corresponding first or second read control signal is "L".

Signal processor 107 calculates distance data using the digital signal received from light receiver 104 and detects the presence or absence of interference. Then, signal processor 107 causes a display such as a liquid crystal display (LCD), which is not illustrated, to display the distance data and output a message about the presence or absence of interference.

Figure 1B:
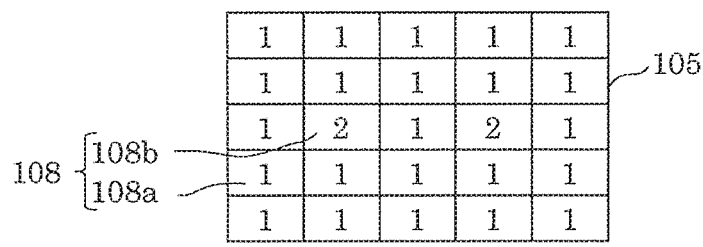
FIG. 1B is a diagram showing an arrangement of pixels included in a solid-state imaging device shown in FIG. 1A.

Next, the pixels of solid-state imaging device 105 are described in more detail. FIG. 1B is a diagram showing an arrangement of pixels 108 included in solid-state imaging device 105.

Pixels 108 are divided into the first pixel group and the second pixel group. In FIG. 1B, a pixel indicated as "1" is pixel 108a that belongs to the first pixel group and a pixel indicated as "2" is pixel 108b that belongs to the second pixel group.

Pixel 108a of the first pixel group operates by receiving the first read control signal. Pixel 108b of the second pixel group operates by receiving the second read control signal. In the present embodiment, solid-state imaging device 105 includes a 5 by 5 matrix of 25 pixels. Moreover, positions of pixels 108b that belong to the second pixel group are as shown in FIG. 1B in the present embodiment. It should be noted that the total number of pixels and the positions of pixels 108b that belong to the second pixel group are not limited to the stated number and positions.

Note that pixel 108a of the first pixel group and pixel 108b of the second pixel group correspond to a first pixel and a second pixel, respectively, according to the present disclosure.

Figure 1C:
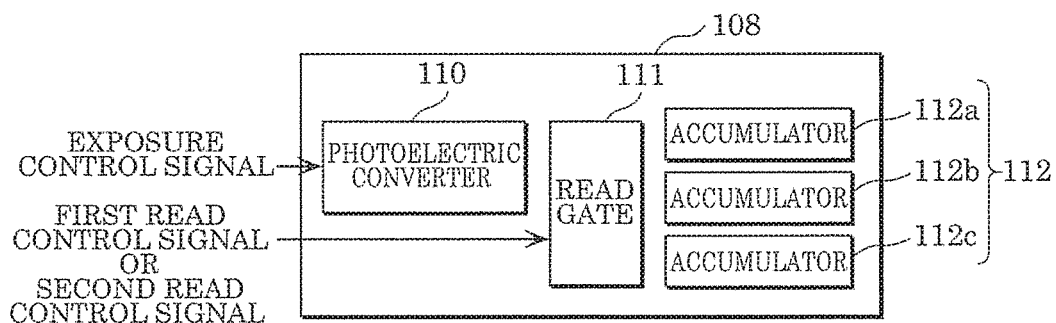
FIG. 1C is a schematic diagram showing a configuration of a pixel included in the solid-state imaging device shown in FIG. 1A.

FIG. 1C is a schematic diagram showing a configuration of pixel 108 included in solid-state imaging device 105. Pixel 108a of the first pixel group and pixel 108b of the second pixel group have no distinction and thus have the same configuration (except for the read control signal to be connected).

As shown in FIG. 1C, pixel 108 includes photoelectric converter 110, read gate 111, and accumulator 112. Photoelectric converter 110 converts the received light into electric charge. Read gate 111 functions as a gate that allows the electric charge converted by photoelectric converter 110 to be transferred to accumulator 112, and performs a gate open-close operation according to the read control signal.

Note that, in pixel 108, the electric charge of photoelectric converter 110 can be transferred to accumulator 112 only when read gate 111 is open.

The read control signal is a binary digital signal having a value represented as either "H" or "L". In the present embodiment, the read gate is open when the read control signal is "H".

Accumulator 112 accumulates electric charge. Note that the electric charge to be accumulated can be divided among a plurality of accumulators 112. In the present embodiment, accumulator 112 includes first accumulator 112a, second accumulator 112b, and third accumulator 112c. First accumulator 112a, second accumulator 112b, and third accumulator 112c accumulate electric charges exposed in a first exposure period, a second exposure period, and a third exposure period, respectively. These exposure periods are described later.

It should be noted that the first read control signal and the second read control signal are not simultaneously sent as "H" in the present embodiment. Note also that when the second read control signal is "H", the light emission control signal is not sent as "H" (that is, light is not emitted). On this account, pixel 108a of the first pixel group is used for distance measurement, and pixel 108b of the second pixel group is used only for interference detection.

Here, a basic operation performed by distance measuring apparatus 101 according to the present embodiment, or more specifically, a method of calculating distance L to a subject by a TOF (pulse TOF) method, is described. The following describes two methods, that is, a first TOF method and a second TOF method, which are different in the control of the light emission control signal.

Hereinafter, the first TOF method is described, with reference to FIG. 2A and FIG. 2B.

Figure 2A:
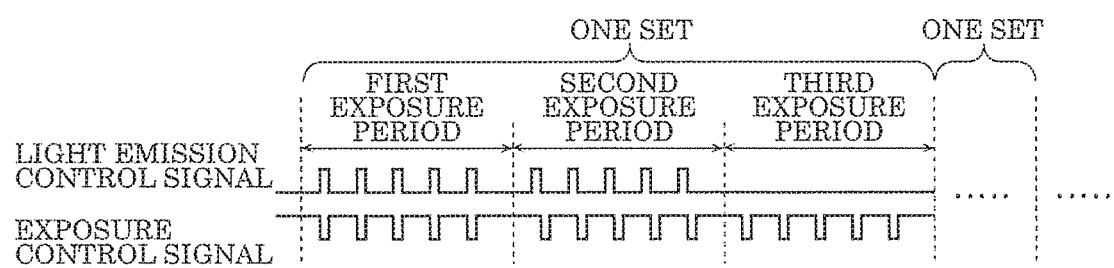
FIG. 2A is a timing chart showing a light emission control signal and an exposure control signal according to a first TOF method.

FIG. 2A is a timing chart showing a light emission control signal and an exposure control signal according to the first TOF method. FIG. 2B is a timing chart showing a first exposure period and a second exposure period shown in FIG. 2A. For the purpose of illustration, FIG. 2B shows two cases in which the respective timings are different originally. More specifically, FIG. 2B shows the exposure control signal in the first exposure period along with the exposure control signal in the second exposure period.

As shown in FIG. 2A, distance measuring apparatus 101 has three periods in which the respective methods of controlling light emission and exposure are different. The three periods are the first exposure period, the second exposure period, and the third exposure period. Distance measuring apparatus 101 repeats light emission and exposure in one set of these three periods.

Note that no reflected light is received from a different distance measuring apparatus in an operation described as follows. Although not illustrated for the sake of simplicity, note also that the read control signal is "H" all the time (that is, read gate 111 is open) and that electric charge photoelectrically converted in a pixel is accumulated in accumulator 112.

The first exposure period shown in FIG. 2A synchronizes with a light emission timing of the light source. The second exposure period that is different from the first exposure period synchronizes with the light emission timing of the light source. In the third exposure period, no light reflected from the light emitted from the light source is included.

In the first exposure period, a pulse of the light emission control signal and a pulse of the exposure control signal have the same phase and same pulse width To. As shown in FIG. 2B, the emitted light is reflected off the subject and this reflected light returns at a corresponding time depending on a distance to the subject. On this account, when the distance to the subject is longer, the amount of exposure in the first exposure period is smaller. The electric charge exposed in the first exposure period is accumulated in first accumulator 112a. Note that the amount of exposure in the first exposure period is represented as "S0".

In the second exposure period, the light emission control signal and the exposure control signal have same pulse width To and have different phases. As shown in FIG. 2B, upon a falling edge of the light emission control signal, the exposure control signal rises. Thus, within a distance measurement range, when the distance to the subject is longer, the amount of exposure in the second exposure period is larger. The electric charge exposed in the second exposure period is accumulated in second accumulator 112b. Note that the amount of exposure in the second exposure period is represented as "S1".

In the third exposure period, distance measuring apparatus 101 does not emit light and performs only background light exposure. For this reason, the light emission control signal is "L" all the time. A pulse width of the exposure control signal in this period is the same as pulse width To as in the first and second exposure periods. The electric charge exposed in the third exposure period is accumulated in third accumulator 112c. Note that the amount of exposure in the third exposure period, or more specifically, the amount of background light exposure, is represented as "BG".

Here, a total amount of reflected light is calculated by adding the following together: the amount of exposure calculated by subtracting the amount of background light exposure (referred to as "BG" hereinafter) from the amount of exposure in the first exposure period (referred to as "S0" hereinafter); and the amount of exposure calculated by subtracting BG from the amount of exposure in the second exposure period (referred to as "S1" hereinafter). Signal processor 107 calculates the distance on the basis of a ratio of the amount of exposure of the reflected light obtained in the second exposure period to the total amount of reflected light. When a pulse width of the light emission control signal is represented as To and a speed of light (299,792.458 m/s) is represented as C, distance L to the subject can be expressed by Equation 1 below.

[Math. 1]

$$L = \frac{c \cdot T_0}{2} \times \frac{S1 - BG}{(S0 - BG) + (S1 - BG)} \quad \text{Equation 1}$$

Here, pulse width To may be determined according to a distance measurement range and a desired degree of accuracy. For example, when no distortion (delay) is present in the pulse slope and the distance measurement range is 3.3 m, pulse width To is about 22 ns. As can be understood from Equation 1, the distance measurement range increases when pulse width To is larger, according to the first TOF method. In this case, however, the distance measurement accuracy is reduced. On the other hand, when pulse width To is smaller, the distance measurement accuracy increases. In this case, however, the distance measurement range is reduced.

Figure 3A:
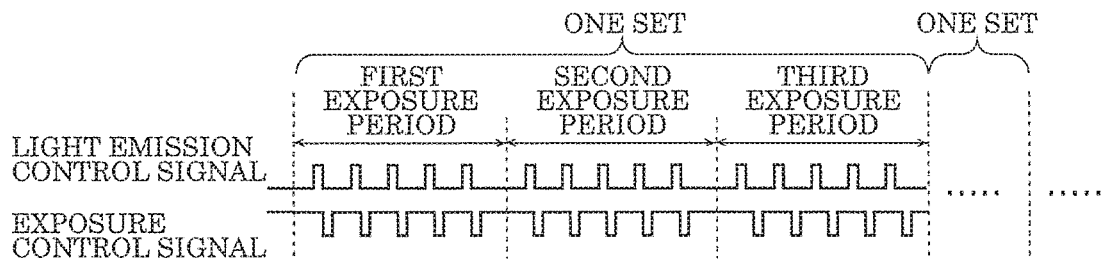
FIG. 3A is a timing chart showing a light emission control signal and an exposure control signal according to a second TOF method.
Figure 3B:
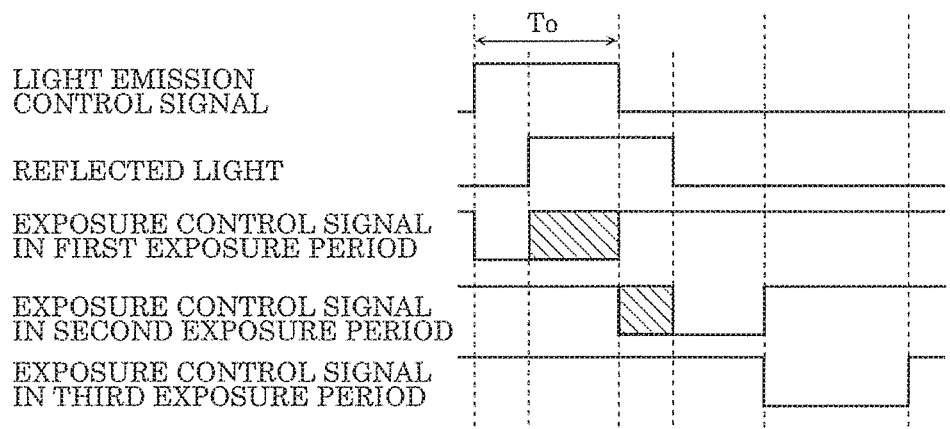
FIG. 3B is a timing chart showing when reflected light is received at a light emission timing and an exposure timing in a first exposure period and a second exposure period shown in FIG. 3A.
Figure 3C:
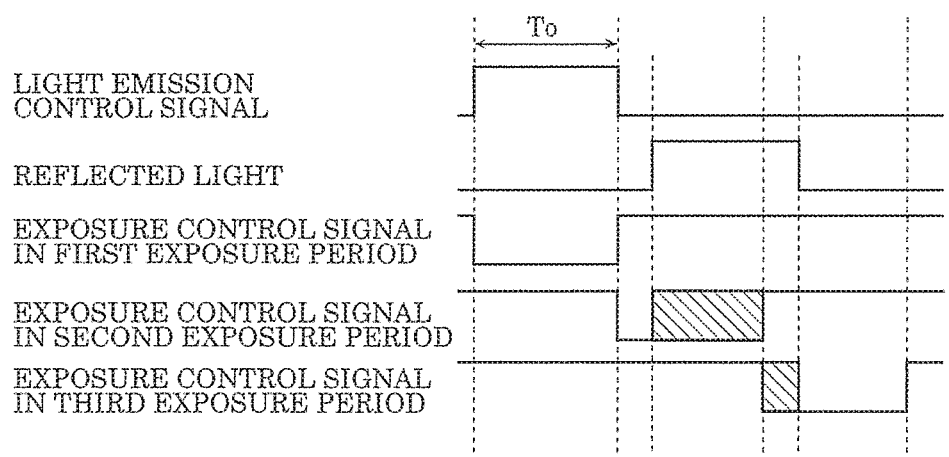
FIG. 3C is a timing chart showing when reflected light is received at a light emission timing and an exposure timing in the second exposure period and a third exposure period shown in FIG. 3A.

Next, the second TOF method is described, with reference to FIG. 3A to FIG. 3C. The second TOF method allows the distance measurement range to be doubled without changing the distance measurement accuracy, as compared with the first TOF method. FIG. 3A is a timing chart showing the light emission control signal and the exposure control signal according to the second TOF method. FIG. 3B is a timing chart showing when the reflected light is received at a light emission timing and an exposure timing in the first exposure period and the second exposure period shown in FIG. 3A. FIG. 3C is a timing chart showing when the reflected light is received at a light emission timing and an exposure timing in the second exposure period and the third exposure period shown in FIG. 3A. For the purpose of illustration, each of FIG. 3B and FIG. 3C shows three exposure periods in which the respective timings are different originally. More specifically, each of FIG. 3B and FIG. 3C shows the exposure control signals in the first exposure period, the second exposure period, and the third exposure period together. The second TOF method is different from the first TOF method in that light emission is performed in the third exposure period as well.

As shown in FIG. 3A, the light emission control signal and the exposure control signal have same pulse width To in the third exposure period, and the exposure control signal falls after a lapse of a To time from the falling edge of the light emission control signal. With this, although the third exposure period is used for background light exposure, distance measuring apparatus 101 exposes the reflected light depending on the distance to the subject in this period.

The reflected light from the subject is exposed at different timings, depending on the distance. More specifically, the reflected light from the subject is exposed according to the exposure timing used in the first exposure period and the second exposure period (Case 1), and is exposed according to the exposure timing used in the second exposure period and the third exposure period (Case 2).

In Case 1, the reflected light returns in the following periods as shown in FIG. 3B: a period in which the exposure control signal is active (that is, "L") in the first exposure period; and a period in which the exposure control signal is active (that is, "L") in the second exposure period. Thus, the reflected light is exposed in the first exposure period and the second exposure period, and the background light is exposed in the third exposure period.

On the other hand, in Case 2, the reflected light returns in the following periods as shown in FIG. 3C: a period in which the exposure control signal is active (that is, "L") in the second exposure period; and a period in which the exposure control signal is active (that is, "L") in the third exposure period. Thus, the reflected light is exposed in the second exposure period and the third exposure period, and the background light is exposed in the first exposure period.

Assume that whether the background light is exposed in the first exposure period or the third exposure period is determined according to a magnitude of a signal level. Assume also that the exposure amount with a lower signal level is determined as the amount of background light exposure (BG). To be more specific, when the amount of exposure in the first exposure period is larger than the amount of exposure in the third exposure period (Case 1), the amount of exposure in the first exposure period is represented as S0, the amount of exposure in the second exposure period is represented as S1, and the amount of exposure in the third exposure period is represented as BG. On the other hand, when the amount of exposure in the first exposure period is smaller than or equal to the amount of exposure in the third exposure period (Case 2), the amount of exposure in the second exposure period is represented as S0, the amount of exposure in the third exposure period is represented as S1, and the amount of exposure in the first exposure period is represented as BG.

Distance L1 to the subject in Case 1 is calculated according to Equation 2-1 below. Distance L2 to the substrate in Case 2 is calculated according to Equation 2-2 below.

[Math. 2]
$$L1 = \frac{c \cdot T_0}{2} \times \frac{S1 - BG}{S0 - BG + S1 - BG} \quad \text{Equation 2-1}$$

[Math. 3]
$$L2 = \frac{c \cdot T_0}{2} \times \frac{S1 - BG}{S0 - BG + S1 - BG} + \frac{c \cdot T_0}{2} \quad \text{Equation 2-2}$$

Figure 4A:
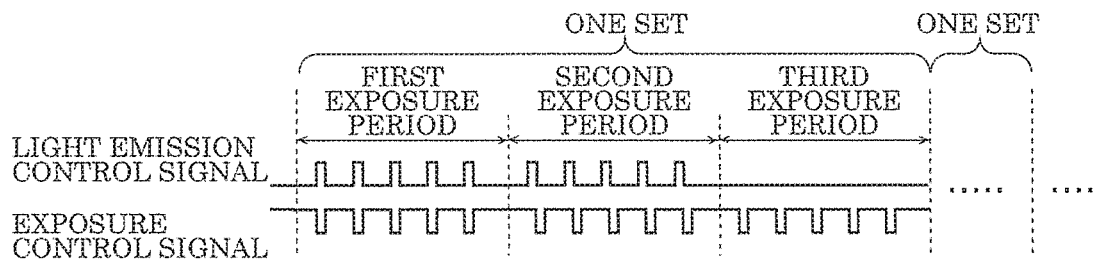
FIG. 4A is a timing chart showing a light emission control signal and an exposure control signal according to the first TOF method.
Figure 4B:
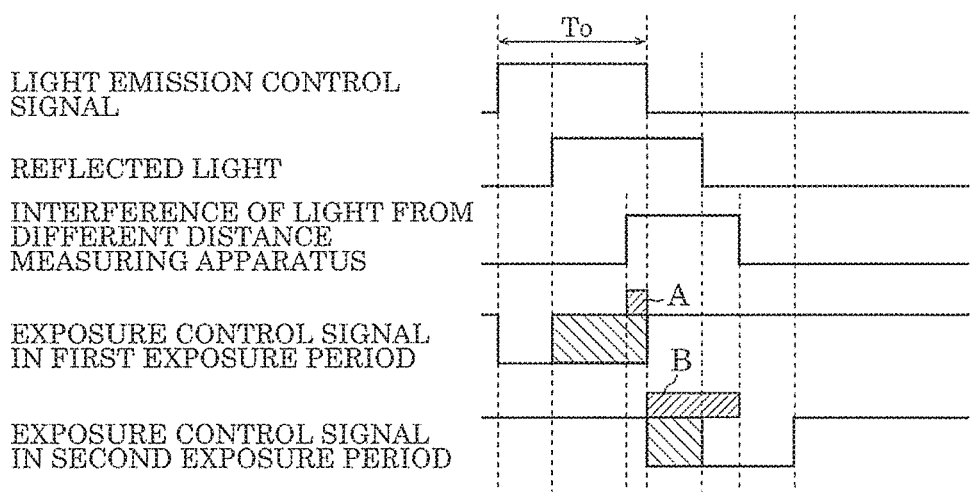
FIG. 4B is a timing chart showing a first exposure period and a second exposure period shown in FIG. 4A.
Figure 4C:
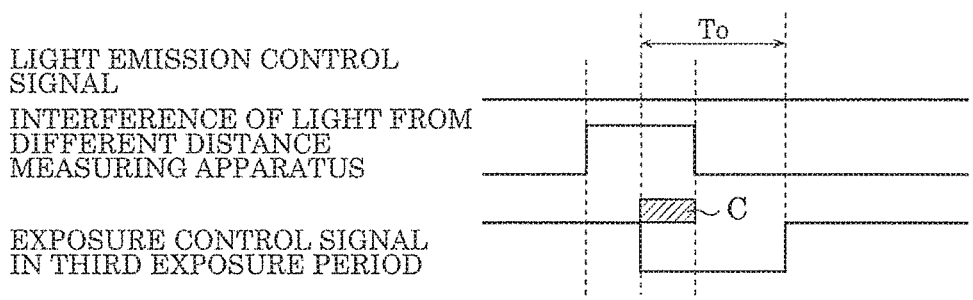
FIG. 4C is a timing chart showing a third exposure period shown in FIG. 4A.

Next, the following describes a principle of a distance measurement error caused when light is received from a different distance measuring apparatus while the distance measurement is being performed according to the first TOF method, with reference to FIG. 4A to FIG. 4C. FIG. 4A is a timing chart showing the light emission control signal and the exposure control signal according to the first TOF method. FIG. 4B is a timing chart showing the first exposure period and the second exposure period shown in FIG. 4A. FIG. 4C is a timing chart showing the third exposure period shown in FIG. 4A.

Figure 2B:
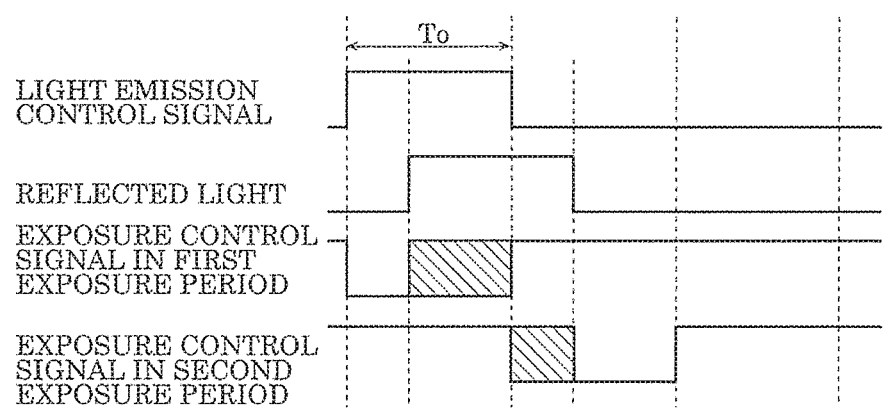
FIG. 2B is a timing chart showing a first exposure period and a second exposure period shown in FIG. 2A.

The timing charts shown in FIG. 4B and FIG. 4C are different from the timing chart shown in FIG. 2B in that light emission from a different distance measuring apparatus is present. For the purpose of illustration, FIG. 4B shows two cases in which the respective timings are different originally. More specifically, FIG. 4B shows the exposure control signal in the first exposure period along with the exposure control signal in the second exposure period.

In the case shown in FIG. 4B, a light emission pulse from the different distance measuring apparatus is present in the first exposure period and the second exposure period. Moreover, in the case shown in FIG. 4C, a light emission pulse from the different distance measuring apparatus is present in the third exposure period. The light emission pulses from the different distance measuring apparatus are present quite independently of the timings of the light emission and exposure pulses of distance measuring apparatus 101 according to the present embodiment.

Assume that the amount of exposure when the light emission pulse from the different distance measuring apparatus is exposed in the first exposure period is represented as "A". Assume also that the amount of exposure when this light emission pulse is exposed in the second exposure period is represented as "B", and that the amount of exposure when this light emission pulse is exposed in the third exposure period is represented as "C". In this case, distance L to the subject is expressed by Equation 3 below.

[Math. 4]
$$L = \frac{c \cdot T_0}{2} \times \frac{(S1 + B) - (BG + C)}{(S0 + A) + (S1 + B) - 2 \times (BG + C)} \quad \text{Equation 3}$$

The light emission pulse from the different distance measuring apparatus is present independently of the amounts of exposure S0, S1, and BG that are to be measured by distance measuring apparatus 101. Thus, a significant error is caused to distance L depending on the amounts of exposure A, B, and C.

Figure 5:
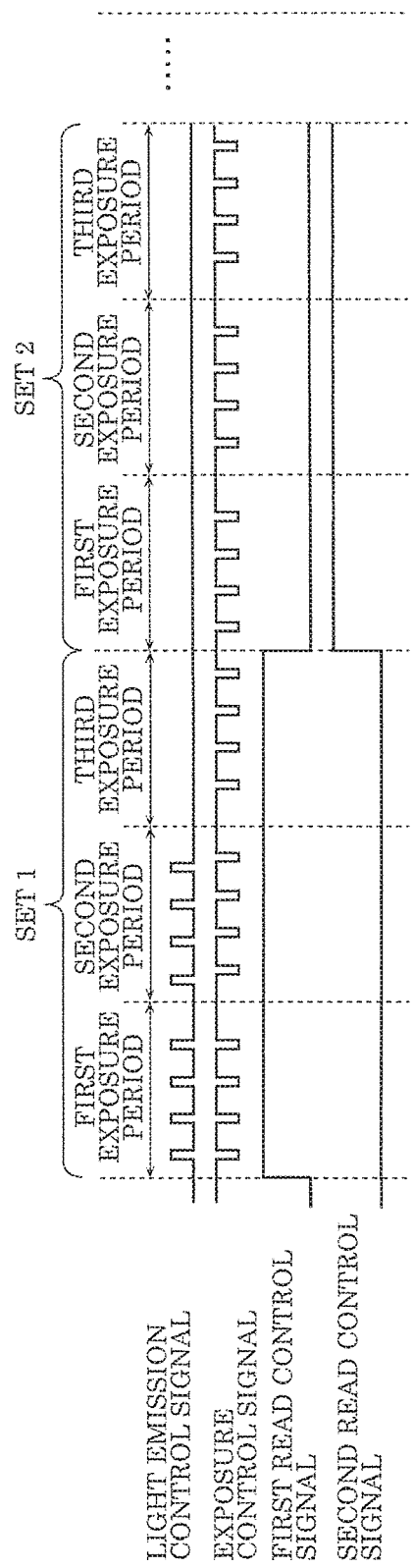
FIG. 5 is a timing chart showing a light emission control signal, an exposure control signal, a first read control signal, and a second read control signal, according to Embodiment 1.

Next, the following describes a method used by distance measuring apparatus 101 to detect the presence or absence of interference caused by the light emission pulse from the different distance measuring apparatus, according to the present embodiment. In the present embodiment, exposure and light emission are performed according to a timing chart shown in FIG. 5. FIG. 5 is the timing chart showing a light emission control signal, an exposure control signal, a first read control signal, and a second read control signal.

Assume that, in FIG. 5, distance measuring apparatus 101 controls light emission and exposure according to the first TOF method (thus, no light is emitted in the third exposure period). As shown in FIG. 5, "Set 1" refers to a period in which the first read control signal is "H" and the second read control signal is "L" over the consecutive first to third exposure periods. Moreover, "Set 2" refers to a period in which the first read control signal is "L" and the second read control signal is "H" over the consecutive first to third exposure periods.

Exposure controller 106 of distance measuring apparatus 101 outputs the first read control signal and the second read control signal. The first read control signal opens and closes read gate 111 of pixel 108a belonging to the first pixel group, and the second read control signal opens and closes read gate 111 of pixel 108b belonging to the second pixel group.

As shown in FIG. 5, since the first read control signal is "H" and the second read control signal is "L" in Set 1, the photoelectrically-converted charge is read out from pixel 108a of the first pixel group for each of the exposure periods and then accumulated into accumulator 112. Moreover, although an operation from exposure to photoelectric conversion is performed in pixel 108b of the second pixel group, the electric charge is not accumulated into accumulator 112. More specifically, the amount of electric charge in accumulator 112 is zero.

On the other hand, since the first read control signal is "L" and the second read control signal is "H" in Set 2, the photoelectrically-converted charge is read out from pixel 108b of the second pixel group for each of the exposure periods and then accumulated into accumulator 112. Moreover, since read gate 111 of pixel 108a of the first pixel group is closed, the photoelectrically-converted charge is not accumulated into accumulator 112. Furthermore, since the light emission control signal is "L" all the time in Set 2, distance measuring apparatus 101 does not emit light. For this reason, the reflected light of the light emission pulse from distance measuring apparatus 101 is not received by pixel 108b of the second pixel group regardless of the current exposure period.

To be more specific, when no interference of light is present, pixel 108b of the second pixel group exposes the background light in each of the first to third exposure periods.

Here, signal processor 107 generates distance data for each of pixels 108 according to Equation 1, on the basis of the signal values of pixel 108a belonging to the first pixel group. Moreover, BG signal levels of the amounts of exposure in the third exposure period are compared between a predetermined pixel (pixel 108b in this case) belonging to the second pixel group and a predetermined pixel (pixel 108a in this case) belonging to the first pixel group and adjacent to pixel 108b. The amount of exposure in the third exposure period is represented only by the background light level signal originally. Thus, the signal level ratio between pixel 108b and pixel 108a is nearly 1:1 (one-fold).

Here, assume that interference is caused by the light emission pulse from the different distance measuring apparatus. In this case, the light from the different distance measuring apparatus is received regardless of the light emission and exposure timings of distance measuring apparatus 101, that is, out of synchronization with these timings of distance measuring apparatus 101. Thus, the amounts of exposure of pixel 108b and pixel 108a in the third exposure period are not equal to each other. With reference to this relationship, signal processor 107 determines that interference is present when the signal level ratio exceeds a predetermined threshold with respect to a ratio between a period in which the read gate of pixel 108a is open and a period in which the read gate of pixel 108b is open. To be more specific, signal processor 107 calculates a signal level ratio between pixel 108b and pixel 108a in the third exposure period (calculates a value by dividing the BG signal level of pixel 108a by the BG signal level of pixel 108b). When this ratio is smaller than or equal to a threshold, which is obtained by taking shot noise into consideration, with respect to an expected value, that is, 1:1, signal processor 107 determines that no interference is present. When the ratio exceeds this threshold, signal processor 107 determines that interference is present.

Figure 6:
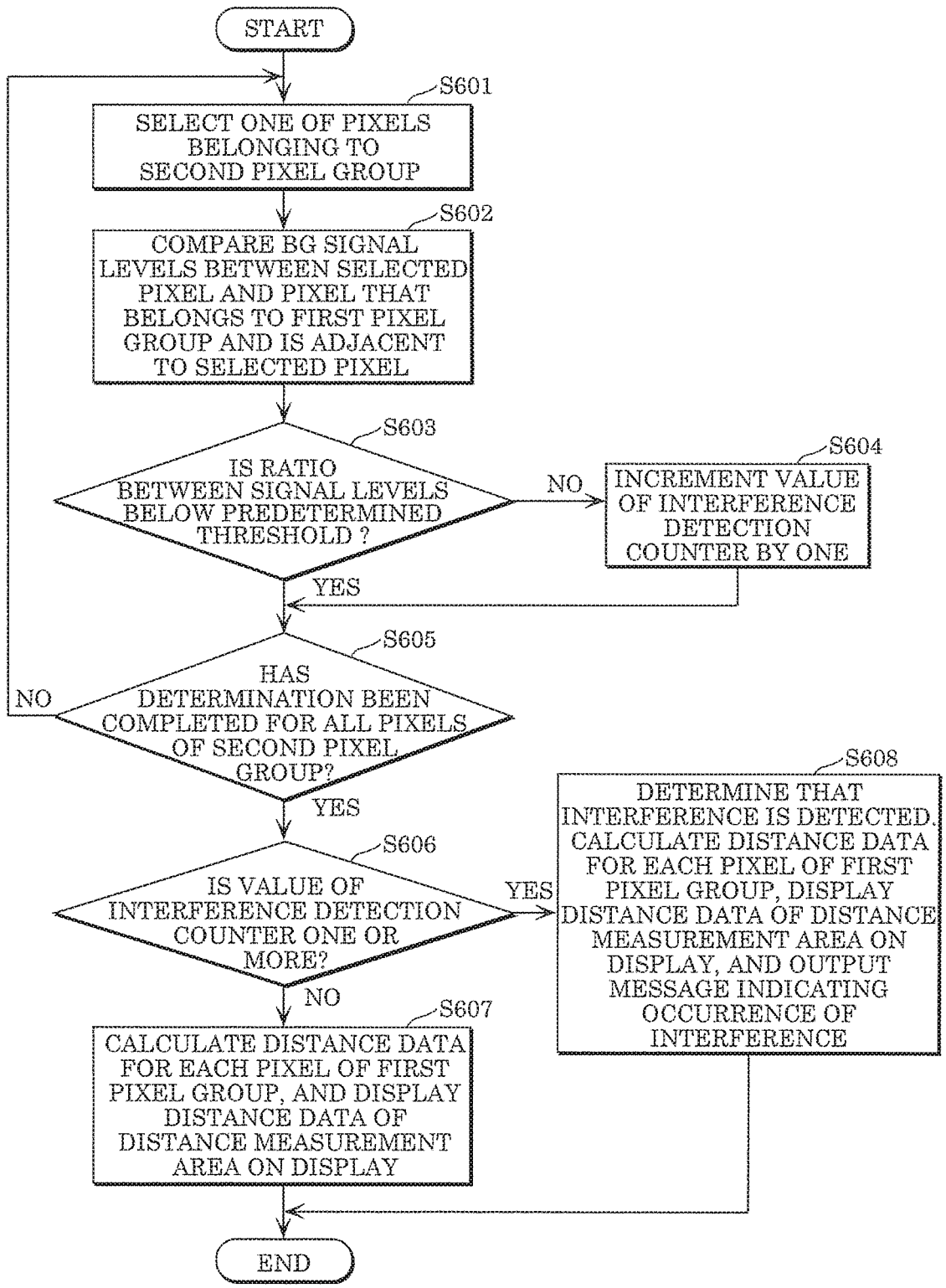
FIG. 6 is a flowchart performed when a signal processor outputs distance data and detects interference, according to Embodiment 1.

FIG. 6 is a flowchart performed when signal processor 107 outputs the distance data and detects interference.

As described in Step S601 of FIG. 6, signal processor 107 first selects one of pixels 108b belonging to the second pixel group.

Next, as described in Step S602, signal processor 107 selects pixel 108a that belongs to the first pixel group and is adjacent to this selected pixel 108b of the second pixel group. Then, signal levels of the amounts of exposure (BG) in the third exposure period are compared between these pixels.

Then, as described in Step S603, signal processor 107 calculates whether a difference between the compared BG signal levels is below a predetermined threshold. Assume that the threshold is determined with consideration given to shot noise caused by photoelectric conversion, in a manner to provide a margin to some extent.

Here, when the difference between the compared BG signal levels exceeds the predetermined threshold (that is, a difference exceeding shot noise is present between the amounts of exposure of two pixels 108a and 108b), signal processor 107 increments a value of an interference detection counter by one as described in Step S604. Then, signal processor 107 proceeds to Step S605. On the other hand, when the difference is below the predetermined threshold in Step S603, signal processor 107 performs no operation and then proceeds to Step S605.

In Step S605, signal processor 107 determines whether the determination of the presence or absence of interference has been completed for all pixels 108b belonging to the second pixel group. When an unprocessed pixel is present, signal processor 107 returns to Step S601 and repeats Step S602 to S605. When all the pixels have been processed, signal processor 107 proceeds to Step S606.

In Step S606, signal processor 107 checks the value of the interference detection counter. When the value of the interference detection counter is below a preset value (such as 1), signal processor 107 calculates the distance data of the measurement area on the basis of the amount of exposure of pixel 108a belonging to the first pixel group and causes a display, such as an LCD, to display the distance data, as described in step S607. On the other hand, when the value of the interference detection counter is larger than or equal to the preset value, signal processor 107 causes the display to display the distance data of the measurement area as well as the message indicating an occurrence of interference, as described in Step S608.

In the present embodiment, distance measuring apparatus 101 does not emit light during the exposure of pixel 108b belonging to the second pixel group. Thus, when no interference is present, a ratio among the amounts of exposure (the signal levels) of pixel 108b belonging to the second pixel group in the first to third exposure periods is nearly 1:1:1. On this account, the signal levels of the amounts of exposure of pixel 108b belonging to the second pixel group may be compared among the first to third exposure periods. Then, interference may be determined as being present when a difference between the signal levels of the amounts of exposure is larger than a predetermined value in at least one of the exposure periods. Moreover, in this case, this determination of interference may be made also using a method of comparing the BG signal level of the predetermined pixel (pixel 108b) belonging to the second pixel group and the BG signal level of the predetermined pixel (pixel 108a) belonging to the first pixel group and adjacent to pixel 108b.

In the present embodiment, assuming that the distance measurement is performed according to the first TOF method, the amounts of exposure (BG) in the third exposure period are compared between the predetermined pixel (pixel 108b) belonging to the second pixel group and the predetermined pixel (pixel 108a) belonging to the first pixel group and adjacent to pixel 108b. In the case of using the second TOF method, a comparison may be made between the lower of the signal levels of pixel 108b in the first and third exposure periods and the lower of the signal levels of pixel 108a in the first and third exposure periods.

In the present embodiment, a length of the light emission and exposure periods of pixel 108a belonging to the first pixel group (that is, Set 1) is equal to a length of the light emission and exposure periods of pixel 108b belonging to the second pixel group (that is, Set 2). However, a relationship of the lengths is not limited to this. For example, to increase the amount of exposure (the signal level) of pixel 108a belonging to the first pixel group and used for distance measurement, Set 1 may be repeated four times after which Set 2 may be provided once. In this case, when the amounts of exposure (BG) in the third exposure period are compared between the predetermined pixel (pixel 108b) belonging to the second pixel group and the predetermined pixel (pixel 108a) belonging to the first pixel group and adjacent to pixel 108b, the ratio between the BG level of pixel 108a and the BG level of pixel 108b is nearly 4:1 (four-fold). Thus, it may be determined that interference is not present when the ratio is smaller than or equal to a predetermined ratio that is obtained by adding margin a to take shot noise into consideration (that is, when the ratio is within a range of (4±α)). Moreover, it may be determined that interference is present when the ratio exceeds this predetermined ratio.

As described thus far, distance measuring apparatus 101 that uses the TOF method according to the present embodiment can detect interference of the light emission pulse from the different distance measuring apparatus. Moreover, when interference is detected, distance measuring apparatus 101 can reduce influence of this interference.

Furthermore, distance measuring apparatus 101 according to the present disclosure can respond to a change in the level of the background light caused by a light distribution change. Thus, occurrence of interference can be detected even when the subject is moving or intensity of light changes.

Embodiment 2

Hereinafter, a configuration and an operation of distance measuring apparatus 101 according to Embodiment 2 is described, with reference to FIG. 1A, FIG. 7, and FIG. 8. Note that the following mainly describes details of differences with Embodiment 1.

In Embodiment 1, pixel 108b belonging to the second pixel group is used only for interference detection and not used for distance measurement. For this reason, the distance measurement data of the area located on pixel 108b belonging to the second pixel group needs to be calculated through conversion using the distance data of neighboring pixels 108a belonging to the first pixel group. Thus, to maintain a resolution of the distance measurement data, a total number of pixels 108b belonging to the second pixel group needs to be smaller with respect a total number of all the pixels, and pixels 108b also need to be scattered.

In the present embodiment, on the other hand, pixel 108b belonging to the second pixel group is also used for distance measurement by distance measuring apparatus 101. Moreover, both pixel 108a belonging to the first pixel group and pixel 108b belonging to the second pixel group are used for interference detection in the present embodiment. With this, the configuration of solid-state imaging device 105 can be simplified. For example, a total number of pixels 108a belonging to the first pixel group may be the same as that of pixels 108b belonging to the second pixel group. In this case, pixels 108a belonging to the first pixel group may be arranged in even-numbered rows and pixels 108b belonging to the second pixel may be arrange in odd-numbered rows.

A configuration of distance measuring apparatus 101 according to the present embodiment is the same as that of distance measuring apparatus 101 shown in FIG. 1A according to Embodiment 1. Thus, an explanation of the configuration of distance measuring apparatus 101 according to the present embodiment is omitted here.

Hereinafter, an operation performed by distance measuring apparatus 101 is described. FIG. 7 is a timing chart showing a light emission control signal, an exposure control signal, a first read control signal, and a second read control signal.

Assume that distance measurement is performed by the second TOF method in the present embodiment. As shown in FIG. 7, "Set 1" refers to a period in which the first read control signal is "H" and the second read control signal is "L" over the consecutive first to third exposure periods. Moreover, "Set 2" refers to a period in which the first read control signal is "L" and the second read control signal is "H" over the consecutive first to third exposure periods.

Figure 7:
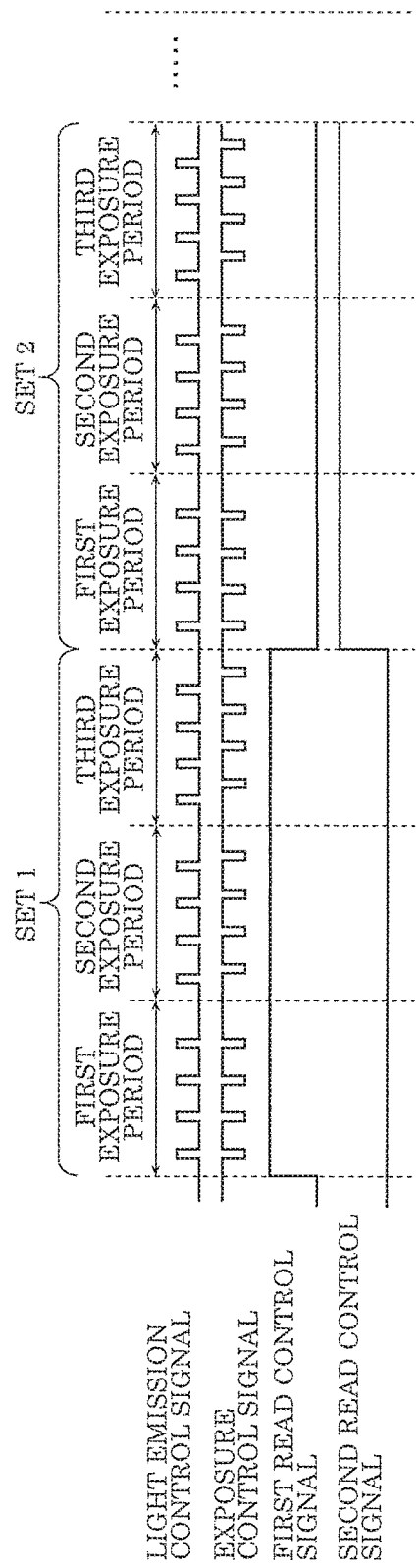
FIG. 7 is a timing chart showing a light emission control signal, an exposure control signal, a first read control signal, and a second read control signal, according to Embodiment 2.

Unlike distance measuring apparatus 101 shown in FIG. 5 according to Embodiment 1, distance measuring apparatus 101 according to the present embodiment causes the light emission control signal to repeat "H" and "L" actively even when the second read control signal is "H" as shown in FIG. 7. Moreover, timings of the light emission control signal and the exposure control signal in Set 1 are the same as those in Set 2.

Here, assume that no interference of light from a different distance measuring apparatus is present. Then, the following ratios are obtained between a predetermined pixel belonging to the second pixel group (referred to as pixel 108b hereinafter) and a predetermined pixel belonging to the first pixel group and adjacent to pixel 108b (referred to as pixel 108a hereinafter): a ratio between the amounts of exposure S0; a ratio between the amounts of exposure S1; and a ratio between the amounts of exposure BG (between the lower of the signal levels of pixel 108b in the first and third exposure periods and the lower of the signal levels of pixel 108a in the first and third exposure periods). In this case, each of these ratios is nearly equal to a ratio between a period in which the first read control signal is "H" and a period in which the second read control signal is "H" (that is, this ratio is 1:1).

On the other hand, assume that interference of light is present here. In this case, the respective signal levels of S0, S1, and BG are not the same between pixel 108b and pixel 108a. With reference to this relationship, signal processor 107 calculates ratios between the following: a ratio between the lower of the signal levels of pixel 108b in first accumulator 112a and third accumulator 112c and the lower of the signal levels of pixel 108a in first accumulator 112a and third accumulator 112c; a ratio between the signal levels in second accumulators 112b of pixels 108b and 108a; and a ratio between the higher of the signal levels in first accumulator 112a and third accumulator 112c of pixel 108b and the higher of the signal levels in first accumulator 112a and third accumulator 112c of pixel 108a. Then, when at least one of these three ratios exceeds a predetermined threshold with respect to the ratio between the period in which read gate 111 of pixel 108a is open and the period in which read gate 111 of pixel 108b is open, signal processor 107 determines that interference is present. More specifically, a threshold in which shot noise is taken into consideration is set. The ratio between the signal levels of pixels 108b and 108a (a value obtained by dividing the signal level of pixel 108a by the signal level of pixel 108b) is calculated for each of the amounts of exposure S0, S1, and BG. Then, whether interference is present by determining whether the signal level ratios between the amounts of exposure S0, S1, and BG of pixel 108b and pixel 108a exceed the threshold with respect to the expected value.

Figure 8:
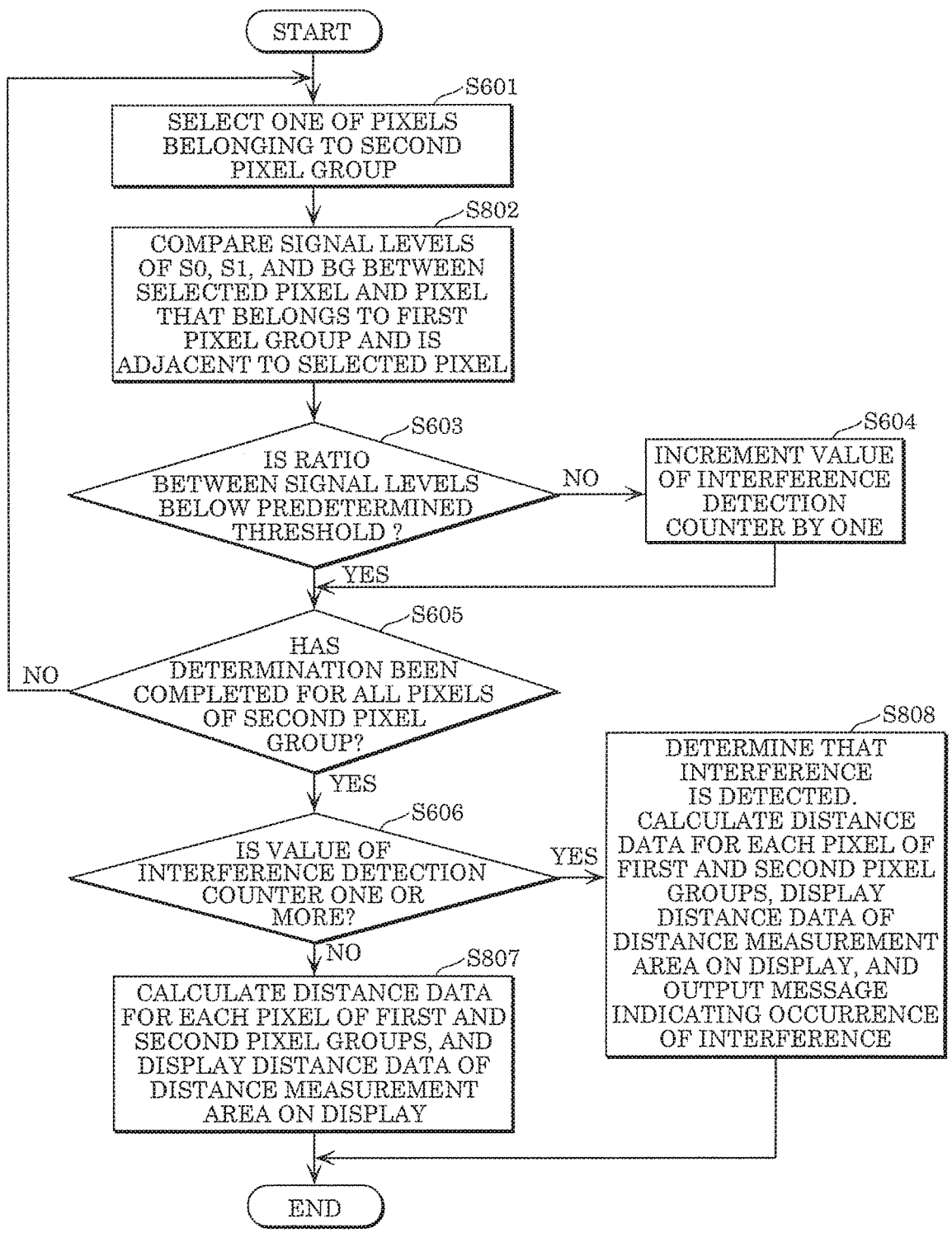
FIG. 8 is a flowchart performed when a signal processor outputs distance data and detects interference, according to Embodiment 2.

FIG. 8 is a flowchart performed when signal processor 107 outputs distance data and detects interference. In FIG. 8, processes that are the same as those in FIG. 6 are assigned the same step number as in FIG. 6.

As described in Step S601 of FIG. 8, signal processor 107 first selects one of pixels 108b belonging to the second pixel group.

Next, as described in Step S802, signal processor 107 selects pixel 108a that belongs to the first pixel group and is adjacent to this selected pixel 108b of the second pixel group. Then, signal levels of the amounts of exposure S0, S1, and BG (the amount of exposure of background light) are compared between these pixels. As described above, the amount of exposure of background light according to the second TOF method refers to the amount of exposure (signal level) in the first exposure period or the amount of exposure (signal level) in the third exposure period, whichever is smaller.

Next, as described in Step S603, signal processor 107 determines, by calculation, whether each of the ratios between the amounts of exposure S0, S1, and BG is within the predetermined threshold. Assume that each of the ratios is calculated with consideration given to shot noise caused by photoelectric conversion, in a manner to provide a margin to some extent.

Here, when the ratios between the amounts of exposure S0, S1, and BG are determined as being larger than or equal to the predetermined threshold as a result of the comparison (or more specifically, the difference between the compared amounts of exposure S0, the difference between the compared amount of exposure S1, or the difference between the compared amounts of exposure BG exceeds the shot noise), signal processor 107 increments a value of an interference detection counter by one as described in Step S604. Then, signal processor 107 proceeds to Step S605. On the other hand, when each of the ratios is below the predetermined threshold in Step S603, signal processor 107 performs no operation and then proceeds to Step S605.

In Step S605, signal processor 107 determines whether the determination of the presence or absence of interference has been completed for all pixels 108b belonging to the second pixel group. When an unprocessed pixel is present, signal processor 107 returns to Step S601 and repeats Step S802 to S605. When all the pixels have been processed, signal processor 107 proceeds to Step S606.

In Step S606, signal processor 107 checks the value of the interference detection counter. When the value of the interference detection counter is below a preset value (such as 1), signal processor 107 calculates distance data for each of the pixels belonging to the first and second pixel groups and causes a display, such as an LCD, to display the distance data, as described in step S807. On the other hand, when the value of the interference detection counter is larger than or equal to the preset value, signal processor 107 calculates the distance data for each of the pixels belonging to the first and second pixel groups and causes the display to display the distance data of the distance measurement area as well as the message indicating an occurrence of interference, as described in Step S808.

The present embodiment has been described thus far, assuming that the distance measurement is performed according to the second TOF method. However, the first TOF method may be used in the present embodiment. In this case, an only difference is a method of identifying the BG signal for each of the pixels.

As described thus far, distance measuring apparatus 101 that uses the TOF method according to the present embodiment can detect interference of the light emission pulse from the different distance measuring apparatus. Moreover, when interference is detected, distance measuring apparatus 101 can reduce influence of this interference.

Furthermore, distance measuring apparatus 101 can respond to a change in the level of the background light caused by a light distribution change. Thus, occurrence of interference can be detected even when the subject is moving or intensity of light changes.

Embodiment 3

Hereinafter, a configuration and an operation of distance measuring apparatus 901 according to Embodiment 3 is described, with reference to FIG. 9A to FIG. 11. Note that the following mainly describes details of differences with Embodiment 2.

Figure 9A:
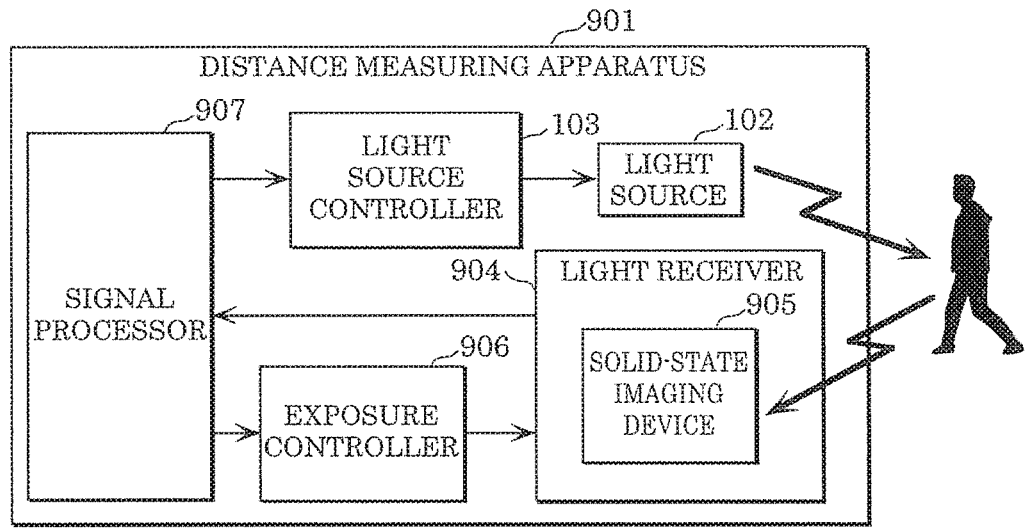
FIG. 9A is a block diagram showing a configuration of a distance measuring apparatus according to Embodiment 3.

FIG. 9A is a block diagram showing a configuration of distance measuring apparatus 901 according to the present embodiment. In this diagram, new numerical values are assigned only to structural elements that have functions and configurations different from those of the corresponding structural elements in distance measuring apparatus 101 shown in FIG. 1A.

Distance measuring apparatus 901 according to the present embodiment includes light receiver 904, solid-state imaging device 905, exposure controller 906, and signal processor 907. These structural elements are different from the corresponding structural elements included in distance measuring apparatus 101 according to Embodiment 1.

Figure 9B:
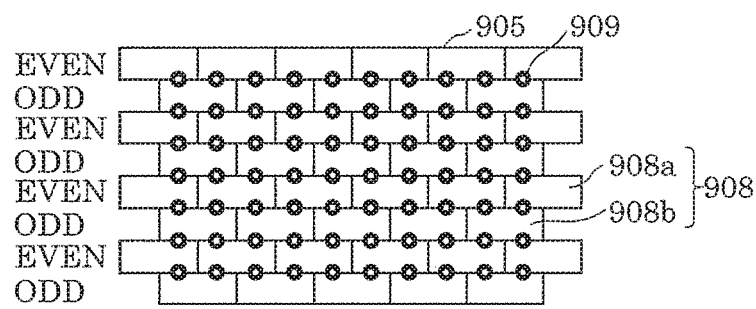
FIG. 9B is a diagram showing a configuration of a solid-state imaging device shown in FIG. 9A and an arrangement of pixels included in the solid-state imaging device.
Figure 9C:
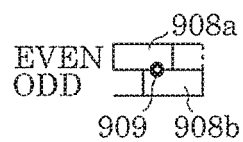
FIG. 9C is a diagram showing an example of an arrangement of an even pixel and an odd pixel shown in FIG. 9A.
Figure 9D:
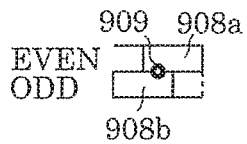
FIG. 9D is a diagram showing an example of an arrangement of an even pixel and an odd pixel shown in FIG. 9A.
Figure 9E:
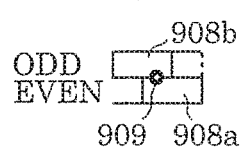
FIG. 9E is a diagram showing an example of an arrangement of an even pixel and an odd pixel shown in FIG. 9A.
Figure 9F:
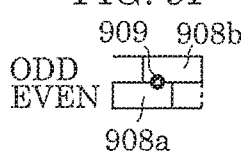
FIG. 9F is a diagram showing an example of an arrangement of an even pixel and an odd pixel shown in FIG. 9A.

FIG. 9B is a diagram showing a configuration of solid-state imaging device 905 and an arrangement of pixels 908 included in solid-state imaging device 905. Each of FIG. 9C to FIG. 9F is a diagram showing an example of an arrangement of an even pixel and an odd pixel.

As shown in FIG. 9B, in solid-state imaging device 905, a first read control signal is connected to pixel 908a of an even-numbered row (that is, pixel 908a is an even pixel) and a second read control signal is connected to pixel 908b of an odd-numbered row (that is, pixel 908b is an odd pixel). In the present embodiment, connections of the first read control signal and the second read control signal alternate every row. However, note that the connections of the first and second read control signals may alternate every column. Moreover, the connections of the first and second read control signals may alternate in a checkered flag pattern or a houndstooth checkered pattern, in solid-state imaging device 905. Here, an opening of pixel 908 of solid-state imaging device 905 is larger in a horizontal direction than in a vertical direction, and even pixel 908a and odd pixel 908b are arranged to be offset from each other by a half pixel in the horizontal direction. Note that the opening of pixel 908 of solid-state imaging device 905 is not limited to the aforementioned structure. For example, the opening of pixel 908 may be shaped in a square, and even pixel 908a and odd pixel 908b may be arranged without offset in the horizontal direction.

It should be noted that even pixel 908a and odd pixel 908b correspond to a first pixel and a second pixel, respectively, according to the present disclosure. Even pixel 908a and odd pixel 908b may alternate every column or every row. Moreover, even pixel 908a and odd pixel 908b may alternate, for example, in a checkered flag pattern or a houndstooth checkered pattern.

According to an instruction from signal processor 907, exposure controller 906 changes a ratio between a period in which the first read control signal is "H" and a period in which the second read control signal is "H" (hereinafter, this ratio is referred to as the read control signal ratio).

Figure 10B:
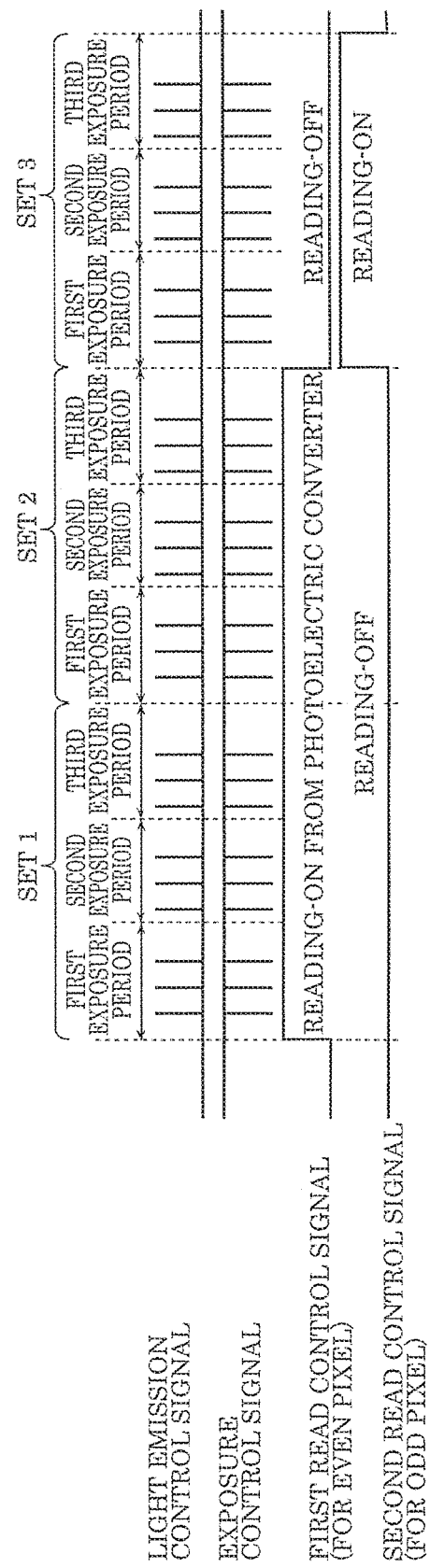
FIG. 10B is a timing chart showing the light emission control signal, the exposure control signal, the first read control signal, and the second read control signal according to Embodiment 3 and also showing the case where the "H" period of the first read control signal does not coincide with the "H" period of the second read control signal.

Each of FIG. 10A and FIG. 10B is a timing chart showing a light emission control signal, an exposure control signal, a first read control signal, and a second read control signal of distance measuring apparatus 901 according to the present embodiment. FIG. 10A shows the case where an "H" period of the first read control signal coincides with an "H" period of the second read control signal. FIG. 10B shows the case where the "H" period of the first read control signal does not coincide with the "H" period of the second read control signal.

Assume that distance measurement is performed according to the second TOF method in the present embodiment. Note also that details of the timings of the light emission control signal and the exposure control signal are the same as those described in Embodiments 1 and 2, and thus are not described explicitly in particular. In FIG. 10A, the first read control signal for even pixel 908a is "H" in both Set 1 and Set 2, and the second read control signal for odd pixel 908b is "H" only in Set 2. On this account, the amount of exposure of even pixel 908a is twice as large as that of odd pixel 908b.

To similarly cause the amount of exposure of even pixel 908a to be twice as large as that of odd pixel 908b, the case shown in FIG. 10B may be employed. In this case, the period in which the first read control signal is "H" does not coincide with the period in which the second read control signal is "H".

In Embodiment 3, the first or second read control signal is controlled in a manner that the amount of exposure of even pixel 908a is twice as large as that of odd pixel 908b. However, a multiple is not limited to two. For example, periods of Set 1 to Set 4 may be provided. Then, the first read control signal may be "H" in all Sets 1 to 4, and the second read control signal may be "H" only in Set 3. In this case, the amount of exposure of even pixel 908a is four times as large as that of odd pixel 908b.

Signal processor 907 calculates distance data using a signal in which the signals of even pixel 908a and odd pixel 908b are mixed. With this, when even pixel 908 having a larger amount of exposure becomes saturated, distance measurement data can be calculated using odd pixel 908b. This case has a merit of increasing the distance measurement range.

As combinations of pixels to be mixed, four cases are shown in FIG. 9C to FIG. 9F. To cause the signal levels of even pixel 908a and odd signal 908b to be equal to each other, the signal level of odd pixel 908b is doubled. More specifically, the signal level of odd pixel 908b is multiplied by the read control signal ratio, after which the signal level of even pixel 908a is added together. Thus, a signal barycenter is located at mixed-grid pixel 909 which is the center of a position where even pixel 908a and odd pixel 908b meet. With this mixture method, as long as even pixel 908a is not saturated, resolution can be maintained.

Next, the following describes a method used by signal processor 907 to detect interference and a method used by signal processor 907 to reduce influence of this interference.

Signal processor 907 calculates ratios between the amounts of exposure S0, S1, and BG of odd pixel 908b and even pixel 908a that are to be mixed. When no interference of light from a different distance measuring apparatus is present, these ratios are the same as the read control signal ratio. Thus, it is determined that interference is present when these ratios are significantly different from a threshold in which shot noise is taken into consideration.

When interference is detected, the distance measurement data is calculated using even pixel 908a or odd pixel 908b that is less influenced by the interference. The pixel that is less influenced by the interference is determined on the basis of a magnitude relationship between the ratios between the amounts of exposure S0, S1, and BG of pixels 908a and 908b and the read control signal ratio.

To be more specific, when the ratio between the signal level of even pixel 908a and the signal level of odd pixel 908b is larger than the read control signal ratio, it is determined that even pixel 908a is influenced more by the interference. Thus, the distance measurement data is calculated using only odd pixel 908b. On the other hand, the ratio between the amount of exposure of even pixel 908a and the amount of exposure of odd pixel 908b is smaller than the read control signal ratio, it is determined that odd pixel 908b is influenced more by the interference. Thus, the distance measurement data is calculated using only even pixel 908a.

When the read control signal ratio is 1:1 (one-fold), the signal levels of the amounts of exposure S0 are compared between even pixel 908a and odd pixel 908b that are adjacent to each other. Similarly, the signal levels of the amounts of exposure S1 are compared between these adjacent pixels, and the signal levels of the amounts of exposure BG are compared between these adjacent pixels. When a difference exceeding a predetermined threshold is present as a result of the comparison, the distance measurement data may be calculated using only the signal of the pixel that has the lower signal level.

Figure 11:
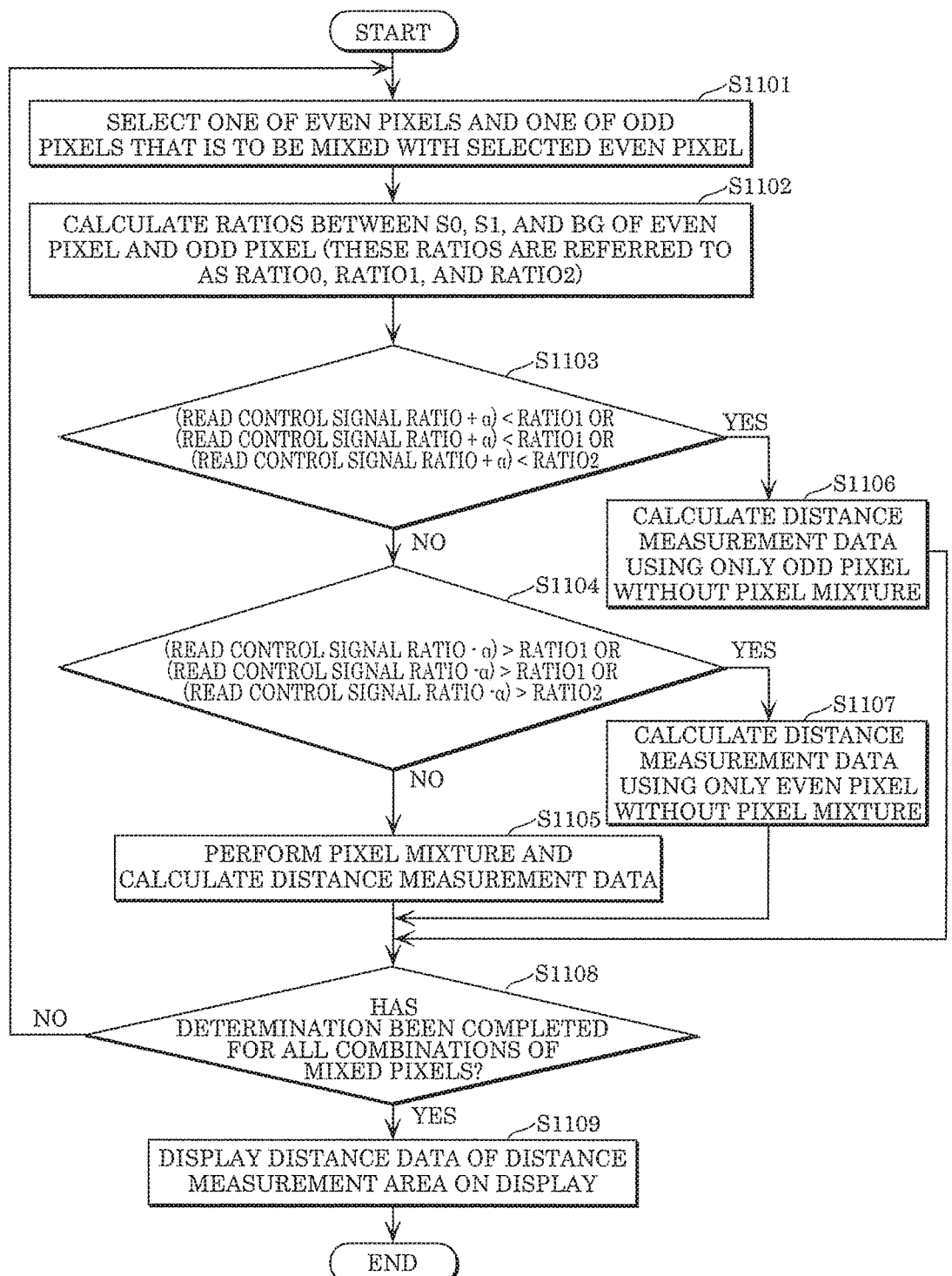
FIG. 11 is a flowchart performed when distance data output, interference detection, and interference influence reduction are executed, according to Embodiment 3.

FIG. 11 is a flowchart performed when distance data output, interference detection, and interference influence reduction are executed by distance measuring apparatus 901 according to the present embodiment. For the sake of simplicity, assume that each of even pixel 908a and odd pixel 908b is not saturated.

As described in Step S1101, one of even pixels 908a is first selected and one of odd pixels 908b to be mixed with selected even pixel 908a is selected.

Next, as described in Step S1102, the respective ratios between the amounts of exposure S0, S1, and BG of even pixel 908a and odd pixel 908b (hereinafter, referred to as RATIO0, RATIO1, and RATIO2, respectively) are calculated.

Then, as described in Step S1103, whether each of RATIO0, RATIO1, and RATIO2 is larger than a value obtained by adding a margin (a) to the read control signal ratio is determined. When a result of the determination is Yes in Step S1103, the process proceeds to Step S1106. In this case, since odd pixel 908b is less influenced, the distance measurement data is calculated using odd pixel 908b.

On the other hand, the result of the determination is No in Step S1103, whether each of RATIO0, RATIO1, and RATIO2 is smaller than a value obtained by subtracting the margin (a) from the read control signal ratio is determined. When a result of the determination is Yes in Step S1104, the process proceeds to Step S1107. In this case, since even pixel 908a is less influenced, the distance measurement data is calculated using even pixel 908a. When the result of the determination is No in Step S1104, the process proceeds to Step S1105.

The process in Step S1105 is performed when no interference is detected. As described in Step S1105, signal processor 907 mixes the signal levels of even pixel 908a and odd pixel 908b, or more specifically, performs pixel mixture. Then, signal processor 907 calculates the distance measurement data of the position in mixed-grid pixel 909.

After the calculation of the distance measurement data of the position in mixed-grid pixel 909, whether the determination of the presence or absence of interference has been completed for all the combinations of mixed pixels, as described in Step S1108. When the determination has been completed for all the combinations, or more specifically, when the result is Yes in Step S1108, the distance data of the distance measurement area is displayed on the display as described in Step S1109. When the determination has not been completed yet, or more specifically, when the result is No in Step S1108, the process returns to Step S1101 and Steps S1101 to S1108 are repeated for another combination of mixed pixels. Then, the distance data is displayed on the display in Step S1109.

The present embodiment has been described thus far, assuming that the distance measurement is performed according to the second TOF method. However, the first TOF method may be used in the present embodiment. In this case, an only difference is a method of identifying the BG signal for each of the pixels.

In this way, distance measuring apparatus 901 according to the present embodiment can dynamically detect the interference of the light emission pulse from the different distance measuring apparatus. Moreover, distance measuring apparatus 901 mixes the two pixels having the different charge accumulation periods to calculate the distance measurement data. Thus, the dynamic range for distance measurement can be increased.

Furthermore, when the interference of the light emission pulse from the different distance measuring apparatus is detected, the distance measurement data is calculated using the pixel that is less influenced by the interference. As a result, the influence of the interference can be reduced.

Although the distance measuring apparatus according to the present disclosure has been described by way of the above exemplary embodiments, it should be obvious that the present disclosure is not limited to the above exemplary embodiments.

For example, each of the distance measuring apparatuses described in the above exemplary embodiments has the pixels belonging to the first pixel group and the pixels belonging to the second pixel group. However, the number of pixel groups is not limited to two and may be increased. Thus, the number of pixels may also be increased in accordance with the increased number of pixel groups.

Moreover, the pixel of the first pixel group and the pixel of the second pixel group may be arranged in any manner. For example, these pixels may be arranged alternately in the row direction or in the column direction, or may be arranged alternately in the checkered flag or houndstooth checkered pattern.

Although the distance measuring apparatus in an aspect or aspects has been described by way of the above exemplary embodiments, it should be obvious that the present disclosure is not limited to the above exemplary embodiments. Other embodiments implemented through various changes and modifications conceived by a person of ordinary skill in the art or through a combination of the structural elements in different embodiments described above may be included in the scope in an aspect or aspects according to the present disclosure, unless such changes, modifications, and combination depart from the scope of the present disclosure.

INDUSTRIAL APPLICABILITY

The distance measuring apparatus according to the present disclosure can detect interference of light and can also reduce influence of this interference. Thus, the distance measuring apparatus can be used in improving the accuracy of distance measurement performed for a person or a building.

What is claimed is:
1. A distance measuring apparatus which uses a time-of-flight (TOF) method, the distance measuring apparatus comprising:
a light source which emits light;
a light source controller which issues a light emission instruction to the light source at a predetermined timing;
a light receiver which includes a plurality of pixels that receive incident light and are arranged two-dimensionally;
an exposure controller which issues an exposure instruction to the light receiver; and
a signal processor which calculates data of a distance to a subject using a signal received by the light receiver, and determines whether interference is present,
wherein each of the plurality of pixels includes: a photoelectric converter which converts the incident light into electric charge; an accumulator which accumulates the electric charge; and a read gate that passes the electric charge converted by the photoelectric converter to the accumulator,
the plurality of pixels include: a first pixel which opens and closes the read gate according to a first read control signal that has a predetermined timing; and a second pixel which opens and closes the read gate according to a second read control signal that has a timing different from the predetermined timing of the first read control signal, the exposure controller issues the exposure instruction by outputting the first read control signal and the second read control signal to the light receiver, the light receiver outputs, to the signal processor, a signal corresponding to an amount of electric charge accumulated in the accumulator, the signal processor determines that the interference is present when at least one of (i) a ratio between signal levels of a same pixel included in the plurality of pixels, the signal levels representing respective amounts of electric charge in respective exposure periods and (ii) a ratio between a signal level of the first pixel and a signal level of the second pixel exceeds a predetermined threshold with respect to a determination criterion that is based on a difference between a period in which the read gate of the first pixel is open and a period in which the read gate of the second pixel is open, and wherein the signal processor determines that the interference is present when the ratio between the signal level representing the amount of electric charge of the first pixel and the signal level representing the amount of electric charge of the second pixel adjacent to the first pixel exceeds a predetermined threshold with respect to a ratio between the period in which the read gate of the first pixel is open and the period in which the read gate of the second pixel is open.

2. The distance measuring apparatus according to claim 1, wherein the light source controller does not issue the light emission instruction in one of the period in which the read gate of the first pixel is open and the period in which the read gate of the second pixel is open, the exposure controller performs control in a manner that the period in which the read gate of the first pixel is open does not coincide with the period in which the read gate of the second pixel is open, and the signal processor identifies a signal including no reflected light of the light emitted by the light source, from among signals outputted by the light receiver from the plurality of pixels, and calculates a ratio between a signal level of the signal that is from the first pixel and includes no reflected light of the light emitted by the light source and a signal level of the signal that is from the second pixel and includes no reflected light of the light emitted by the light source.

3. The distance measuring apparatus according to claim 1, wherein each of the plurality of pixels includes: a first accumulator which accumulates the electric charge exposed in a first exposure period that synchronizes with a light emission timing of the light source; a second accumulator which accumulates the electric charge exposed in a second exposure period that synchronizes with the light emission timing of the light source and that is different from the first exposure period; and a third accumulator which accumulates the electric charge exposed in a third exposure period in which no reflected light of the light emitted by the light source is included, and the signal processor calculates (i) a ratio between the signal level of the first accumulator of the first pixel and the signal level of the first accumulator of the second pixel, (ii) a ratio between the signal level of the second accumulator of the first pixel and the signal level of the second accumulator of the second pixel, and (iii) a ratio between the signal level of the third accumulator of the first pixel and the signal level of the third accumulator of the second pixel, and determines that the interference is present when at least one of the three ratios between the signal levels is different from the ratio between the period in which the read gate of the first pixel is open and the period in which the read gate of the second pixel is open.

4. The distance measuring apparatus according to claim 1, wherein each of the plurality of pixels includes: a first accumulator which accumulates the electric charge exposed in a first exposure period that synchronizes with a light emission timing of the light source; a second accumulator which accumulates the electric charge exposed in a second exposure period that synchronizes with the light emission timing of the light source and that follows the first exposure period; and a third accumulator which accumulates the electric charge exposed in a third exposure period that synchronizes with the light emission timing of the light source and that follows the second exposure period, and the signal processor calculates (i) a ratio between a lower of the signal levels in the first accumulator and the third accumulator of the first pixel and a lower of the signal levels in the first accumulator and the third accumulator of the second pixel, (ii) a ratio between the signal level in the second accumulator of the first pixel and the signal level in the second accumulator of the second pixel, and (iii) a ratio between a higher of the signal levels in the first accumulator and the third accumulator of the first pixel and a higher of the signal levels in the first accumulator and the third accumulator of the second pixel, and determines that interference is present when at least one of the three ratios between the signal levels exceeds the predetermined threshold with respect to the ratio between the period in which the read gate of the first pixel is open and the period in which the read gate of the second pixel is open.

5. The distance measuring apparatus according to claim 1, wherein the exposure controller outputs the first read control signal and the second read control signal in a manner that the period in which the read gate of the first pixel is open does not coincide with the period in which the read gate of the second pixel is open, each of the plurality of pixels includes a plurality of accumulators which accumulate respective electric charges in the respective exposure periods, the light source controller does not issue the light emission instruction in one of the period in which the read gate of the first pixel is open and the period in which the read gate of the second pixel is open, and the signal processor compares the signal levels between the plurality of accumulators of one of the first pixel and the second pixel that has a timing of the light emission instruction that does not synchronize with the period in which the read gate is open, and determines that the interference is present when a difference between the signal levels is larger than or equal to a predetermined value.

6. The distance measuring apparatus according to claim 5, wherein the signal processor further identifies a signal including no reflected light of the light emitted by the light source, from among signals outputted by the light receiver from the plurality of pixels, and determines that the interference is present when a ratio between a signal level of the signal that is from the first pixel and includes no reflected light of the light emitted by the light source and a signal level of the signal that is from the second pixel and includes no reflected light of the light emitted by the light source exceeds a predetermined threshold with respect to the ratio between the signal levels in the period in which the read gate of the first pixel is open and the period in which the read gate of the second pixel is open.

7. The distance measuring apparatus according to claim 2, wherein each of the plurality of pixels includes: a first accumulator which accumulates the electric charge exposed in a first exposure period that synchronizes with a light emission timing of the light source; a second accumulator which accumulates the electric charge exposed in a second exposure period that synchronizes with the light emission timing of the light source and that is different from the first exposure period; and a third accumulator which accumulates the electric charge exposed in a third exposure period in which no reflected light of the light emitted by the light source is included, and the signal processor determines one of the first pixel and the second pixel that has a timing of the light emission instruction that synchronizes with the period in which the read gate is open, as having the signal that includes no reflected light of the light emitted by the light source in the third accumulator.

8. The distance measuring apparatus according to claim 2, wherein each of the plurality of pixels includes: a first accumulator which accumulates the electric charge exposed in a period based on a first exposure period that synchronizes with a light emission timing of the light source; a second accumulator which accumulates the electric charge exposed in a second exposure period that synchronizes with the light emission timing of the light source and that follows the first exposure period; and a third accumulator which accumulates the electric charge exposed in a third exposure period that synchronizes with the light emission timing of the light source and that follows the second exposure period, and the signal processor determines one of the first pixel and the second pixel that has a timing of the light emission instruction that synchronizes with the period in which the read gate is open, as having the signal with the signal level that is a lower of the signal levels in the first accumulator and the third accumulator, as the signal that includes no reflected light of the light emitted by the light source.

9. A distance measuring apparatus which uses a time-of-flight (TOF) method, the distance measuring apparatus comprising:
   a light source which emits light;
   a light source controller which issues a light emission instruction to the light source at a predetermined timing;
   a light receiver which includes a plurality of pixels that receive incident light and are arranged two-dimensionally;
   an exposure controller which issues an exposure instruction to the light receiver; and
   a signal processor which calculates data of a distance to a subject using a signal received by the light receiver, and detects whether interference is present,
   wherein each of the plurality of pixels includes: a photoelectric converter which converts the incident light into electric charge; an accumulator which accumulates the electric charge; and a read gate that passes the electric charge converted by the photoelectric converter to the accumulator,
   the plurality of pixels include: a first pixel which opens and closes the read gate according to a first read control signal that has a predetermined timing; and a second pixel which opens and closes the read gate according to a second read control signal that has a timing different from the predetermined timing of the first read control signal,
   the light receiver includes the first pixel and the second pixel which are arranged alternately,
   the exposure controller issues the exposure instruction by outputting the first read control signal and the second read control signal to the light receiver,
   the light receiver outputs, to the signal processor, a signal corresponding to an amount of electric charge accumulated in the accumulator, and
   the signal processor
      determines that the interference is present when a ratio between a signal level of the first pixel and a signal level of the second pixel adjacent to the first pixel exceeds a predetermined threshold with respect to a ratio between a period in which the read gate of the first pixel is open and a period in which the read gate of the second pixel is open,
      calculates, when it is determined for the first pixel and the second pixel that the interference is not present, the data of the distance to the subject using a signal in which a signal of the first pixel and a signal of the second pixel adjacent to the first pixel are mixed, and
      outputs, when it is determined for the first pixel and the second pixel that the interference is present, the data of the distance using one of the first pixel and the second pixel that is determined as being less influenced by the interference on the basis of a magnitude relationship between (i) the ratio between the signal level of the first pixel and the signal level of the second pixel and (ii) the ratio between the period in which the read gate of the first pixel is open and the period in which the read gate of the second pixel is open.

10. The distance measuring apparatus according to claim 9, wherein the first pixel and the second pixel are arranged alternately in one of a row direction, a column direction, a checkered flag pattern, and a houndstooth checkered pattern.

11. The distance measuring apparatus according to claim 9, wherein each of the plurality of pixels includes: a first accumulator which accumulates the electric charge exposed in a first exposure period that synchronizes with a light emission timing of the light source; a second accumulator which accumulates the electric charge exposed in a second exposure period that synchronizes with the light emission timing of the light source and that is different from the first exposure period; and a third accumulator which accumulates the electric charge exposed in a third exposure period in which no reflected light of the light emitted by the light source is included, and the signal processor calculates (i) a ratio between the signal level of the first accumulator of the first pixel and the signal level of the first accumulator of the second pixel, (ii) a ratio between the signal level of the second accumulator of the first pixel and the signal level of the second accumulator of the second pixel, and (iii) a ratio between the signal level of the third accumulator of the first pixel and the signal level of the third accumulator of the second pixel, and determines that the interference is present when at least one of the three ratios between the signal levels exceeds the predetermined threshold with respect to the ratio between the period in which the read gate of the first pixel is open and the period in which the read gate of the second pixel is open.

12. The distance measuring apparatus according to claim 9,
wherein each of the plurality of pixels includes: a first accumulator which accumulates the electric charge exposed in a period based on a first exposure period that synchronizes with a light emission timing of the light source; a second accumulator which accumulates the electric charge exposed in a second exposure period that synchronizes with the light emission timing of the light source and that follows the first exposure period; and a third accumulator which accumulates the electric charge exposed in a third exposure period that synchronizes with the light emission timing of the light source and that follows the second exposure period, and the signal processor calculates (i) a ratio between a lower of the signal levels in the first accumulator and the third accumulator of the first pixel and a lower of the signal levels in the first accumulator and the third accumulator of the second pixel, (ii) a ratio between the signal level in the second accumulator of the first pixel and the signal level in the second accumulator of the second pixel, and (iii) a ratio between a higher of the signal levels in the first accumulator and the third accumulator of the first pixel and a higher of the signal levels in the first accumulator and the third accumulator of the second pixel, and determines that interference is present when at least one of the three ratios between the signal levels exceeds the predetermined threshold with respect to the ratio between the period in which the read gate of the first pixel is open and the period in which the read gate of the second pixel is open.

13. The distance measuring apparatus according to claim 9,
wherein the exposure controller outputs the first read control signal and the second read control signal in a manner that the period in which the read gate of the first pixel is open includes the period in which the read gate of the second pixel is closed and the period in which the read gate of the second pixel is open, and,
when it is determined that the interference is present, the signal processor calculates distance measurement data using one of the first pixel and the second pixel that has a lower signal level.

14. The distance measuring apparatus according to claim 9,
wherein the exposure controller outputs the first read control signal and the second read control signal in a manner that the period in which the read gate of the first pixel is open is different from the period in which the read gate of the second pixel is closed, and
when the interference is present, the signal processor calculates distance measurement data using the signal of the second pixel when the ratio between the signal levels of the first pixel and the second pixel that are mixed is larger than the ratio between the period in which the read gate of the first pixel is open and the period in which the read gate of the second pixel is open, and calculates the distance measurement data using the signal of the first pixel when the ratio between the signal levels of the first pixel and the second pixel that are mixed is smaller than the ratio between the period in which the read gate of the first pixel is open and the period in which the read gate of the second pixel is open.

15. The distance measuring apparatus according to claim 14,
wherein the exposure controller outputs the first read control signal and the second read control signal in a manner that the period in which the read gate of the first pixel is open coincides at least partially with the period in which the read gate of the second pixel is open.

16. The distance measuring apparatus according to claim 14,
wherein the exposure controller outputs the first read control signal and the second read control signal in a manner that the period in which the read gate of the first pixel is open does not coincide with the period in which the read gate of the second pixel is open.

17. The distance measuring apparatus according to claim 14,
wherein when the interference is not present, the signal processor multiplies the signal level of one of the first pixel and the second pixel that has a shorter period in which the read gate is open by the ratio between the period in which the read gate of the first pixel is open and the period in which the read gate of the second pixel is open, and adds the multiplied signal level to the signal level of one of the first pixel and second pixel that has a longer period in which the read gate is open.

\* \* \* \* \*